(12) United States Patent
Okuda et al.

(10) Patent No.: US 8,687,378 B2
(45) Date of Patent: Apr. 1, 2014

(54) HIGH-FREQUENCY MODULE

(71) Applicant: Murata Manufacturing Co., Ltd., Nagaokakyo (JP)

(72) Inventors: Nobuyoshi Okuda, Nagaokakyo (JP); Masaaki Kanae, Nagaokakyo (JP); Naoki Hayasaka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/973,134

(22) Filed: Aug. 22, 2013

(65) Prior Publication Data

US 2013/0335938 A1 Dec. 19, 2013

Related U.S. Application Data

(63) Continuation of application No. PCT/JP2012/069652, filed on Aug. 2, 2012.

(30) Foreign Application Priority Data

Oct. 17, 2011 (JP) ................................. 2011-228050

(51) Int. Cl.
*H05K 7/06* (2006.01)
*H01L 23/49* (2006.01)
*H01L 23/538* (2006.01)

(52) U.S. Cl.
USPC ............ 361/760; 361/767; 361/772; 361/776; 257/784

(58) Field of Classification Search
USPC ................. 361/760, 767, 772, 776; 257/784
See application file for complete search history.

(56) References Cited

U.S. PATENT DOCUMENTS

| | | | | |
|---|---|---|---|---|
| 7,282,793 B2 * | 10/2007 | Akram | ........................ | 257/686 |
| 7,298,032 B2 * | 11/2007 | Kim et al. | .................... | 257/686 |
| 7,622,794 B1 * | 11/2009 | Fan | .............................. | 257/666 |
| 7,898,080 B2 * | 3/2011 | Otremba | ....................... | 257/732 |
| 8,008,765 B2 * | 8/2011 | Kang | ............................ | 257/686 |
| 8,039,970 B2 * | 10/2011 | Yamamori et al. | ............ | 257/777 |
| 8,143,100 B2 * | 3/2012 | Karnezos | ..................... | 438/109 |

(Continued)

FOREIGN PATENT DOCUMENTS

| | | |
|---|---|---|
| JP | 2001-345653 A | 12/2001 |
| JP | 2002-222913 A | 8/2002 |
| JP | 2005-079421 A | 3/2005 |
| JP | 2008-177505 A | 7/2008 |
| JP | 2012-199363 A | 10/2012 |

OTHER PUBLICATIONS

Official Communication issued in International Patent Application No. PCT/JP2012/069652, mailed on Nov. 6, 2012.

*Primary Examiner* — Jeremy Norris
*Assistant Examiner* — Nathan Milakovich
(74) *Attorney, Agent, or Firm* — Keating & Bennett, LLP (57) ABSTRACT

A high-frequency module includes first and second switch IC elements and a substrate. The first and second switch IC elements are the same or substantially the same IC chips, and are mounted in the same or substantially the same orientation. The first switch IC element is mounted on the substrate. The second switch IC element is mounted above the first switch IC element. Due to wire bonding, the individual pad electrodes of the first and second switch IC elements are connected to the land electrodes of the substrate, which are to be connected to the individual pad electrodes. Between a pad electrode and a land electrode connected to each other, another land electrode is not provided.

6 Claims, 5 Drawing Sheets

(56) References Cited

U.S. PATENT DOCUMENTS

| | | |
|---|---|---|
| RE43,720 E * | 10/2012 | Perino et al. .................. 257/686 |
| 2002/0096755 A1 | 7/2002 | Fukui et al. |
| 2003/0102556 A1 * | 6/2003 | Moriguchi et al. ........... 257/723 |
| 2004/0245652 A1 * | 12/2004 | Ogata ........................... 257/777 |
| 2006/0197211 A1 * | 9/2006 | Miyata et al. ................. 257/686 |
| 2012/0079176 A1 * | 3/2012 | Sun et al. ...................... 711/103 |
| 2012/0203954 A1 * | 8/2012 | Sun et al. ...................... 711/103 |

* cited by examiner

HIGH-FREQUENCY MODULE

BACKGROUND OF THE INVENTION

1. Field of the Invention

The present invention relates to a high-frequency module that includes a switch circuit connecting a set of balanced terminals to a plurality of sets of balanced terminals in a switching manner.

2. Description of the Related Art

In communication terminals, downsizing thereof has been increasingly required, and in some cases, the signals of a plurality of systems are processed in a single circuit element. In addition, in order to achieve this processing, a method for switching the signals of a plurality of systems and inputting these signals to a common circuit element has been utilized. In this case, the signals of the individual systems are switched by a switch element and input to the common circuit element.

Here, when the signals of the individual systems are balanced signals, it is necessary to provide a switch element in each line defining a balanced line, for example, as in the high-frequency module described in Japanese Unexamined Patent Application Publication No. 2001-345653. In addition, in such a high-frequency module, these switch elements are usually mounted next to each other on a substrate.

However, in the configuration of the related art, since individual switch elements are mounted next to each other, a mounting area on a substrate becomes large. In addition, when a plurality of balanced terminals to be switched and connected to a common balanced terminal are arranged in different directions with respect to the surface of the substrate, the patterns of different communication signals intersect each other as described in the circuit pattern of FIG. 4 in Japanese Unexamined Patent Application Publication No. 2001-345653, and an isolation characteristic between communication signals is deteriorated. In addition, when patterns are configured so as to intersect with each other, a measure such as arranging the patterns so as to be spaced apart from each other in the thickness direction of the substrate becomes necessary, and the shape of the substrate becomes complicated.

SUMMARY OF THE INVENTION

Preferred embodiments of the present invention provide a high-frequency module that includes a switch circuit connecting one balanced terminal to one of a plurality of balanced terminals in a switching manner, using a simple and small-sized configuration.

A high-frequency module according to a preferred embodiment of the present invention includes a first switch IC and a second switch IC, in which the arrangements of pad electrodes of the first and second switch ICs are the same or substantially the same as one another. The high-frequency module includes a substrate including land electrodes connected to the pad electrodes and electrodes connecting the first switch IC and the second switch IC to an external circuit. The first switch IC is mounted on the substrate. The second switch IC is mounted on a surface of the first switch IC on a side opposite to the substrate. The first switch IC and the second switch IC are mounted so that the pad electrodes are provided on surfaces of the first and second ICS on sides opposite to the substrate side. The individual pad electrodes and the land electrodes are connected to each other via wire bonding.

With this configuration, since the first switch IC and second switch IC are mounted on the substrate in a stacked state, a mounting area is relatively small as compared to a case in which the first and second switch ICs are mounted next to each other on the substrate.

In addition, in the high-frequency module according to a preferred embodiment of the present invention, it is preferable that the first switch IC and the second switch IC are the same switch ICs.

With this configuration, by stacking only one type of switch IC, it is possible to achieve a switch circuit used for a balanced signal. Accordingly, as compared to a case in which a switch IC used for a balanced signal is newly designed and manufactured, it is possible to easily achieve a switch circuit used for a balanced signal.

In addition, by connecting the first and second switch ICs and the substrate to each other via wire bonding, connections between the first and second switch ICs and the substrate are provided in three dimensions. Due to this, it is possible to easily provide a wiring pattern that would be difficult to achieve in a two-dimensional surface, and it is not necessary to arrange wiring lines so as to intersect with each other on the substrate.

In addition, in the high-frequency module according to a preferred embodiment of the present invention, it is preferable that, between a specified pad electrode and a specified land electrode connected to the specified pad electrode, another land electrode different from the specified land electrode is not provided.

With this configuration, individual wires connecting the individual pad electrodes and the individual land electrodes to be connected to the individual pad electrodes to each other do not intersect with each other. As a result, it is possible to improve isolation between individual circuits connected to individual wires.

In addition, in the high-frequency module according to a preferred embodiment of the present invention, it is preferable that the second switch IC is mounted on a surface of the first switch IC on a side opposite to the substrate using an adhesive.

With this configuration, it is possible to reliably connect the first switch IC and the second switch IC to each other, and it is possible to provide protection between the first switch IC and the second switch IC using the adhesive.

In addition, in the high-frequency module according to a preferred embodiment of the present invention, it is preferable that the first switch IC and the second switch IC are mounted in the same orientation when viewed from a direction perpendicular or substantially perpendicular to the component mounting surface of the substrate.

With this configuration, since the directions of the first switch IC and the second switch IC are the same or substantially the same as one another, it is possible to share a reference based on an alignment mark, and mounting is facilitated. In addition, when the first switch IC includes a first individual terminal and the second switch IC includes a second individual terminal, the first individual terminal and the second individual terminal function as a pair of balanced terminals, the first individual terminal and the second individual terminal overlap or substantially overlap with each other when viewed from a direction perpendicular or substantially perpendicular to the component mounting surface of the substrate. Accordingly, when wire bonding from these first individual terminal and second individual terminal is performed to define balanced lines, the design of the pattern of the land electrodes to be connected to the pad electrodes configuring these individual terminals is simplified.

In addition, the high-frequency module according to a preferred embodiment of the present invention preferably includes the following configuration. The first switch IC includes a first individual terminal defining a balanced terminal, and the second switch IC includes a second individual terminal defining another balanced terminal. A distance between a first pad electrode defining the first individual terminal and a first land electrode connected to the first pad electrode via wire bonding is defined as a first distance. A distance between a second pad electrode defining the second individual terminal and a second land electrode connected to the second pad electrode via wire bonding is defined as a second distance. In addition, the first distance and the second distance are preferably approximately equal to each other.

With this configuration, it is easy to set the length of a first conductor pattern defined by a wire establishing a connection between the first pad electrode and the first land electrode and the length of a second conductor pattern defined by a wire establishing a connection between the second pad electrode and the second land electrode to be equal or substantially equal to each other. Due to this, it is easy to set the lengths of two conductors defining the balanced lines to be equal or substantially equal to each other, such that it is possible to improve the balance characteristic of a balanced signal.

In addition, the high-frequency module according to a preferred embodiment of the present invention preferably includes the following configuration. A third pad electrode in the first switch IC and a fourth pad electrode in the second switch IC are disposed so as to overlap or substantially overlap with each other. The third pad electrode in the first switch IC and the fourth pad electrode in the second switch IC are connected to the same third land electrode. A position at which a wire establishing a connection between the third pad electrode and the third land electrode is connected to the third land electrode is defined as a first position. A position at which a wire establishing a connection between the fourth pad electrode and the third land electrode is connected to the third land electrode is defined as a second position. The first position is spaced apart from positions at which the first and second switch ICs are mounted on the substrate, as compared to the second position.

With this configuration, even if the first switch IC and the second switch IC are stacked one above the other, it is possible to set a distance from the third land electrode in the substrate to the third pad electrode in the first switch IC and a distance from the third land electrode to the fourth pad electrode in the second switch IC to be equal or substantially equal to each other. Due to this, when the same signal is input to the first switch IC and the second switch IC stacked one above the other, it is possible to eliminate a time difference between a timing when the signal is input to the first switch IC and a timing when the signal is input to the second switch IC. For example, when, as described above, the balanced signal is transmitted while being switched by the first switch IC and the second switch IC, it is possible to set the switching timing of the first switch IC and the switching timing of the second switch IC so as to coincide or substantially coincide with each other with a high degree of accuracy.

According various preferred embodiments of the present invention, it is possible to provide a simple and small-sized high-frequency module that includes a switch circuit connecting a set of balanced terminals to a plurality of sets of balanced terminals in a switching manner.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
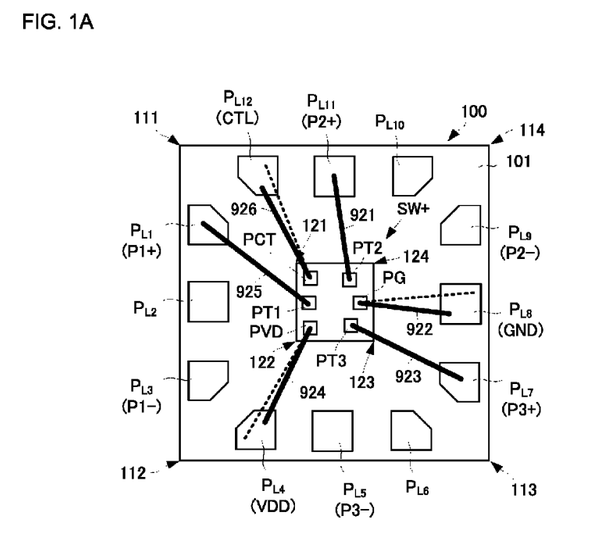
FIGS. 1A and 1B are diagrams illustrating a mounting configuration of a high-frequency module according to a first preferred embodiment of the present invention.
Figure 1B:
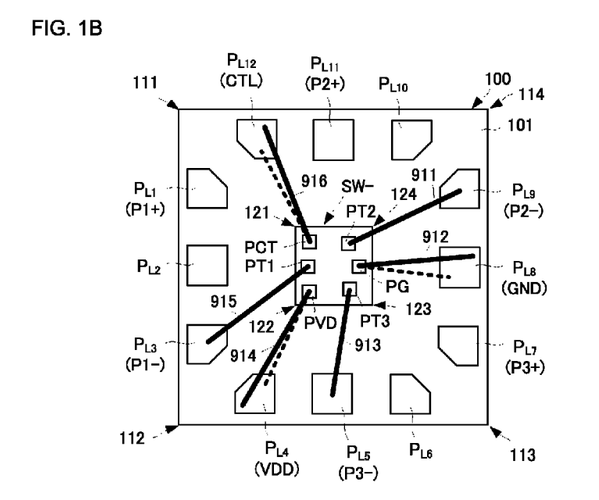
Figure 2:
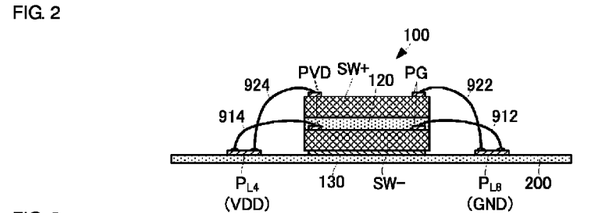
FIG. 2 is a diagram illustrating a bonding concept of the high-frequency module 100 according to the first preferred embodiment of the present invention.
Figure 3:
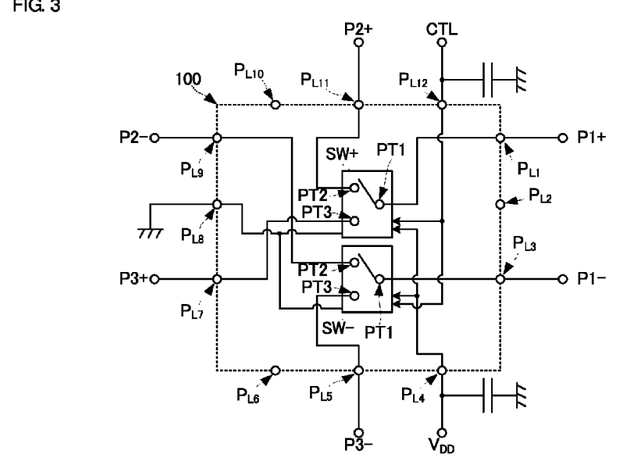
FIG. 3 is an equivalent circuit diagram of the high-frequency module according to the first preferred embodiment of the present invention.

A high-frequency module according to a first preferred embodiment of the present invention will be described with reference to the drawings. FIGS. 1A and 1B are diagrams illustrating the mounting configuration of a high-frequency module 100 according to the first preferred embodiment of the present invention. FIG. 1A illustrates a connection relationship between a substrate 101 and a switch IC element SW+, and FIG. 1B illustrates a connection relationship between the substrate 101 and a switch IC element SW−. FIG. 2 is a diagram illustrating the bonding concept of the high-frequency module 100 according to the first preferred embodiment of the present invention. FIG. 3 is the equivalent circuit diagram of the high-frequency module 100 according to the first preferred embodiment of the present invention.

The high-frequency module 100 according to the first preferred embodiment of the present invention preferably includes the two switch IC elements SW− and SW+ and the substrate 101.

The switch IC element SW− and the switch IC element SW+ are preferably bare chips of semiconductors, for example, and have the same or substantially the same shapes and circuit configuration. Furthermore, the switch IC element SW− and the switch IC element SW+ preferably have the same or substantially the same configuration of pad electrodes used for external connections and the same or substantially the same pattern configuration. The switch IC element SW− corresponds to a "first switch IC", and the switch IC element SW+ corresponds to a "second switch IC". In addition, the dimensions of the switching IC element SW− and the switching IC element SW+ may be different from one another due to manufacturing error or tolerances.

Each of the switch IC elements SW− and SW+ is preferably a SPDT (Single Pole Double Throw) switch, for example, driven by a driving voltage signal VDD from the outside, and connects, in a switching manner, a pad electrode PT1 (a first port) to one of a pad electrode PT2 (a second port) and a pad electrode PT3 (a third port) in response to a control signal CTL.

On the first main surface of the substrate 101, a plurality of land electrodes $P_{L1}$ to $P_{L12}$ are provided using a predetermined array pattern. As schematically illustrated in FIGS. 1A, 1B, and 2, the plural land electrodes $P_{L1}$ to $P_{L12}$ are arranged so as to surround the mounting positions of the switch IC elements SW− and SW+.

More specifically, the plural land electrodes $P_{L1}$ to $P_{L12}$ are arranged in the following pattern. Here, for ease of explanation, it is assumed that the substrate 101 has a rectangular or substantially rectangular planar shape (actually, corresponds to a rectangular-shaped or substantially rectangular-shaped region in the substrate 101).

Substantially along a direction connecting the first corner portion 111 (an upper left corner portion in the front view of FIG. 1) of this rectangular or substantially rectangular shape with the second corner portion 112 thereof (a lower left corner portion in the front view of FIG. 1), the land electrode $P_{L1}$, the land electrode $P_{L2}$, and the land electrode $P_{L3}$ are arranged at intervals with predetermined areas, in order starting from a first corner portion 111 side.

Substantially along a direction connecting the second corner portion 112 with a third corner portion 113 (a lower right corner portion in the front view of FIG. 1), the land electrode $P_{L4}$, the land electrode $P_{L5}$, and the land electrode $P_{L6}$ are arranged at intervals with predetermined areas, in order starting from a second corner portion 112 side.

Substantially along a direction connecting the third corner portion 113 with a fourth corner portion 114 (a upper right corner portion in the front view of FIG. 1), the land electrode $P_{L7}$, the land electrode $P_{L8}$, and the land electrode $P_{L9}$ are arranged at intervals with predetermined areas, in order starting from a third corner portion 113 side.

Substantially along a direction connecting the fourth corner portion 114 with the first corner portion 111, the land electrode $P_{L10}$, the land electrode $P_{L11}$, and the land electrode $P_{L12}$ are arranged at intervals with predetermined areas, in order starting from a fourth corner portion 114 side.

In addition, in the first main surface of the substrate 101, the switch IC element SW− is mounted substantially in the center of a region surrounded by the plural land electrodes $P_{L1}$ to $P_{L12}$. In other words, the first main surface of the substrate 101 is the component mounting surface of the corresponding substrate. The switch IC element SW− is mounted so that the pad electrodes thereof face a side opposite to the substrate 101. The switch IC element SW− is mounted on the substrate 101 preferably using a die-bonding agent 130, for example.

The switch IC element SW+ is mounted on the pad electrode side of the switch IC element SW−. The switch IC element SW+ is mounted so that the pad electrodes thereof face a side opposite to the switch IC element SW− and the substrate 101. The switch IC element SW+ is mounted above the switch IC element SW− preferably using a die film 120, for example.

The switch IC elements SW− and SW+ include pad electrodes PT1, PT2, PT3, PG, PVD, and PCT. The pad electrodes PCT are disposed in the vicinities of the corner portions 121 of the switch IC elements SW− and SW+. The pad electrodes PVD are disposed in the vicinities of the corner portions 122 of the switch IC elements SW− and SW+. The pad electrodes PT1 are disposed between the pad electrodes PCT and the pad electrodes PVD. In other words, the pad electrodes PT1 are disposed at predetermined positions located in the middle of sides connecting the corner portions 121 and 122 with each other in the switch IC elements SW− and SW+. The pad electrodes PT3 are disposed in the vicinities of the corner portions 123 of the switch IC elements SW− and SW+. The corner portions 123 are the opposing corners of the corner portions 121. The pad electrodes PT2 are disposed in the vicinities of the corner portions 124 of the switch IC elements SW− and SW+. The corner portions 124 are the opposing corners of the corner portions 122.

The pad electrodes PG are disposed between the pad electrodes PT3 and the pad electrodes PT2. In other words, the pad electrodes PG are disposed at predetermined positions located in the middle of sides connecting the corner portions 123 and 124 with each other in the switch IC elements SW− and SW+.

The switch IC element SW− and the switch IC element SW+, which have such configurations of pad electrodes, are aligned in the same or substantially the same orientation and mounted when viewed from a direction perpendicular or substantially perpendicular to the component mounting surface of the substrate 101. Furthermore, at this time, the switch IC element SW− and the switch IC element SW+ are mounted so that the corner portions 121 of the switch IC elements SW− and SW+ are located on the corner portion 111 side of the substrate 101 and the corner portions 123 thereof are located on the corner portion 113 side of the substrate 101.

The pad electrode PT1 of the switch element SW− is connected to the land electrode $P_{L3}$ of the substrate 101 by a conductive wire 915. The pad electrode PT2 of the switch element SW− is connected to the land electrode $P_{L9}$ of the substrate 101 by a conductive wire 911. The pad electrode PT3 of the switch element SW− is connected to the land electrode $P_{L5}$ of the substrate 101 by a conductive wire 913. The pad electrode PG of the switch element SW− is connected to the land electrode $P_{L8}$ of the substrate 101 by a conductive wire 912. The pad electrode PVD of the switch element SW− is connected to the land electrode $P_{L4}$ of the substrate 101 by a conductive wire 914. The pad electrode PCT of the switch element SW− is connected to the land electrode $P_{L12}$ of the substrate 101 by a conductive wire 916.

The pad electrode PT1 of the switch element SW+ is connected to the land electrode $P_{L1}$ of the substrate 101 by a conductive wire 925. The pad electrode PT2 of the switch element SW+ is connected to the land electrode $P_{L11}$ of the substrate 101 by a conductive wire 921. The pad electrode PT3 of the switch element SW+ is connected to the land electrode $P_{L7}$ of the substrate 101 by a conductive wire 923. The pad electrode PG of the switch element SW+ is connected to the land electrode $P_{L8}$ of the substrate 101 by a conductive wire 922. The pad electrode PVD of the switch element SW+ is connected to the land electrode $P_{L4}$ of the substrate 101 by a conductive wire 924. The pad electrode PCT of the switch element SW+ is connected to the land electrode $P_{L12}$ of the substrate 101 by a conductive wire 926.

With the configuration described above, the high-frequency module 100 having an equivalent circuit as illustrated in FIG. 3 is achieved. In the high-frequency module 100, first balanced terminals, whose first individual terminal is the pad electrode PT1 of the switch IC element SW− and whose second individual terminal is the pad electrode PT1 of the switch IC element SW+, are selectively connected to second balanced terminals whose individual terminal pair are the pad electrodes PT2 of the switch IC elements SW− and SW+ or third balanced terminals whose individual terminal pair are the pad electrodes PT3 of the switch IC elements SW− and SW+.

A balanced signal, input from an external connection terminal P1+ connected to the land electrode $P_{L1}$ and an external connection terminal P1− connected to the land electrode $P_{L3}$, is input to the first balanced terminals configured by the pad electrodes PT1 of the switch IC elements SW+ and SW−. The switch IC elements SW+ and SW− are supplied with power supplied by the driving voltage signal VDD applied through the land electrode $P_{L4}$ and the pad electrodes PVD, and perform switching control in response to the switching control signal CTL applied through the land electrode $P_{L12}$ and the pad electrodes PCT.

The switch IC elements SW+ and SW− switch the connection states thereof, and thus, the balanced signal input to the first balanced terminals is output to the second balanced terminals or the third balanced terminals. The balanced signal output from the second balanced terminals is output from external connection terminals P2+ and P2− to an external circuit through the land electrodes $P_{L11}$ and $P_{L9}$. The balanced signal output from the third balanced terminals is output from external connection terminals P3+ and P3− to an external circuit through the land electrodes $P_{L7}$ and $P_{L5}$.

In addition, in the high-frequency module 100 having the above-described configuration, the following functional effects are obtained.

The switch IC elements SW− and SW+ are mounted on the component mounting surface of the substrate 101 so as to overlap each other, and thus, it is possible to reduce a mounting area when the switch circuit of a balanced signal includes two switch IC elements.

When the switch IC elements SW− and SW+ are mounted on the substrate 101 using such a configuration as described above, a pad electrode and a land electrode, connected to each other by a conductive wire, are located near each other when viewed from a direction perpendicular to the component mounting surface of the substrate 101, and between these electrodes, another pad electrode or another land electrode is not provided.

For example, the pad electrode PT1 of the switch IC element SW+ and the land electrode $P_{L1}$ are located near each other, and between these electrodes, another pad electrode or another land electrode is not provided. In the same or substantially the same manner, the pad electrode PT1 of the switch IC element SW− and the land electrode $P_{L3}$ are located near each other, and between these electrodes, another pad electrode or another land electrode is not provided.

By using such a configuration, conductive wires transmitting a balanced signal input or output to or from the first balanced terminals, conductive wires transmitting a balanced signal input or output to or from the second balanced terminals, and conductive wires transmitting a balanced signal input or output to or from the third balanced terminals may be provided without intersecting with each other. Due to this, it is possible to significantly reduce or prevent mutual interference between the transmission path of the balanced signal input or output to or from the first balanced terminals, the transmission path of the balanced signal input or output to or from the second balanced terminals, and the transmission path of the balanced signal input or output to or from the third balanced terminals, and it is possible to ensure high isolation between the individual transmission paths. In addition, since it is not necessary to provide an electrode pattern used for intersection in the substrate 101, the electrode pattern of the substrate 101 is simplified, design is facilitated, and formation is also facilitated.

In addition, as illustrated in the above-mentioned FIGS. 1A and 1B, land electrodes are disposed such that distances between the individual pad electrodes of the switch IC elements SW− and SW+, which define the balanced terminals, and land electrodes to which these are connected are preferably equal to or approximately equal to each other. Specifically, for example, a distance between the pad electrode PT1 of the switch IC element SW+ and the land electrode $P_{L1}$, projected on to the component mounting surface of the substrate 101, and a distance between the pad electrode PT1 of the switch IC element SW− and the land electrode $P_{L3}$, projected on to the component mounting surface of the substrate 101, are preferably equal to or approximately equal to each other. Due to this, the transmission distance of a signal between the land electrode $P_{L1}$ and the pad electrode PT1 of the switch IC element SW+ and the transmission distance of a signal between the land electrode $P_{L3}$ and the pad electrode PT1 of the switch IC element SW− are equal to or approximately equal to each other. Accordingly, only by slightly adjusting the wire lengths of the conductive wires 915 and 925, it is possible to improve the balance characteristic of a signal transmitted through the balanced lines.

In addition, while not described in detail, the same relationships between pad electrodes and land electrodes are preferably also maintained with respect to the second balanced terminals and the third balanced terminals, such that it is also possible to improve the balance characteristics of signals transmitted through balanced lines connected to these balanced terminals.

In addition, the balance characteristics of all of the balanced lines are superior, and thus, a high balance characteristic is achieved in the high-frequency module 100.

In addition, the above-described pad electrodes PG, PVD, and PCT in both of the switch IC elements SW− and SW+ are connected to the same land electrodes. However, at this time, as illustrated by dotted lines in FIG. 1 and FIG. 2, a position at which a conductive wire from the switch IC element SW− is connected to a land electrode is spaced away from the mounting positions of the switch IC elements SW− and SW+, as compared to a position at which a conductive wire from the switch IC element SW+ is connected to a land electrode.

Specifically, for example, a position at which the conductive wire 914 that establishes a connection from the pad electrode PVD of the switch IC element SW− to the land electrode $P_{L4}$ of the substrate 101 is connected to the land electrode $P_{L4}$ is farther than a position at which the conductive wire 924 that establishes a connection from the pad electrode PVD of the switch IC element SW+ to the land electrode $P_{L4}$ of the substrate 101 is connected to the land electrode $P_{L4}$.

In the same or similar manner, a position at which the conductive wire 916 that establishes a connection from the pad electrode PCT of the switch IC element SW− to the land electrode $P_{L12}$ of the substrate 101 is connected to the land electrode $P_{L12}$ is farther than a position at which the conductive wire 926 that establishes a connection from the pad electrode PCT of the switch IC element SW+ to the land electrode $P_{L12}$ of the substrate 101 is connected to the land electrode $P_{L12}$.

Furthermore, a position at which the conductive wire 912 that establishes a connection from the pad electrode PG of the switch IC element SW− to the land electrode $P_{L8}$ of the substrate 101 is connected to the land electrode $P_{L8}$ is farther than a position at which the conductive wire 922 that establishes a connection from the pad electrode PG of the switch IC element SW+ to the land electrode $P_{L8}$ of the substrate 101 is connected to the land electrode $P_{L8}$.

Due to this, it is possible to set the wire lengths of a conductive wire from the switch IC element SW+ and a conductive wire from the switch IC element SW− to be equal to or approximately equal to each other, the loop height of the conductive wire from the switch IC element SW+ inevitably becoming high, the loop height of the conductive wire from the switch IC element SW− being controlled so as to be low. Due to this, the lengths of conductors connecting a common land electrode and the switch IC elements SW− and SW+ to each other are equal to or approximately equal to each other.

Accordingly, it is possible to simultaneously supply the driving voltage signal VDD or the switching control signal CTL to the switch IC elements SW− and SW+. In addition, it is possible to set the arrangement of the ground lines of the switch IC elements SW− and SW+ to be the same or substantially the same as each other. Due to this, switching accuracy of the switch circuit of a balanced signal is improved, and it is also possible to improve ground balance between the switch IC elements.

Furthermore, in the same land electrode, a connecting position from the switch element SW− is set to be farther than the switch element SW+, and thus, it becomes easy to perform a wire bonding operation. Therefore, it is possible to prevent contact between wires.

In addition, even if not in the same land electrode, when, as described above, land electrodes are disposed so that distances between the individual pad electrodes of the switch IC elements SW− and SW+, which define the balanced terminals, and land electrodes to which these are connected are equal or approximately equal to each other, a position at which a wire from the switch IC element SW− is connected to a land electrode is farther than a position at which a wire from the switch IC element SW+ is connected to a land electrode, and thus, it is possible to improve the balance characteristic of a signal transmitted through the balanced lines.

Figure 4:
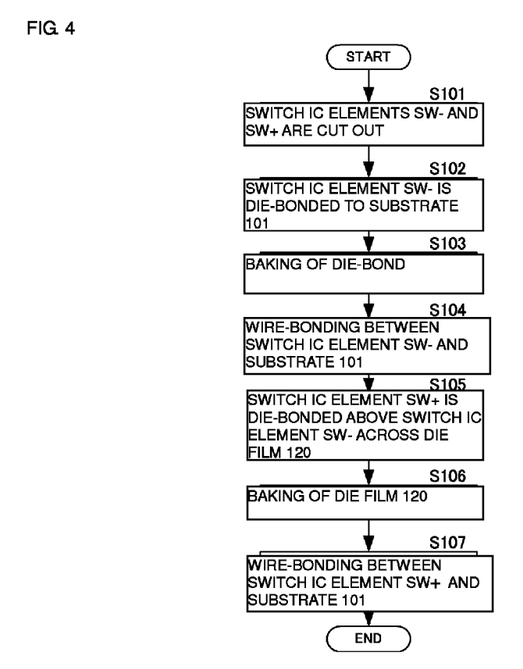
FIG. 4 is a flowchart illustrating a manufacturing process for the high-frequency module according to the first preferred embodiment of the present invention.

In addition, the high-frequency module 100 having such a configuration may be manufactured by a manufacturing process illustrated as follows. FIG. 4 is a flowchart illustrating a non-limiting example of a manufacturing process for the high-frequency module 100 according to the first preferred embodiment of the present invention.

As a first process, the switch IC elements SW− and SW+ are cut out of a semiconductor wafer (S101). At this time, it is preferable that elements cut out of the same semiconductor wafer are used as the switch IC elements SW− and SW+ to be stacked. Due to this, it is possible to combine and use the switch IC elements SW− and SW+ between which a characteristic variation is small.

As a second process, the switch IC element SW− is die-bonded to the substrate 101 (S102). Specifically, a die-bonding agent 130 is applied to the mounting area of the switch IC element SW− in the component mounting surface of the substrate 101, and the switch IC element SW− is mounted. At this time, the switch IC element SW− is mounted with reference to an alignment mark on the substrate 101, not illustrated.

As a third process, the die-bonding agent 130 is subjected to baking, and thus, the switch IC element SW− is temporarily fixed to the substrate 101 (S103). At this time, it is only necessary to fix the switch IC element SW− to the extent that a position is not displaced by the wire bonding or the mounting of the switch IC element SW+ in a subsequent process.

As a fourth process, the pad electrodes of the switch IC element SW− and the land electrodes of the substrate 101 are wire-bonded by wiring lines as illustrated in FIG. 1B (S104). At this time, the wire bonding is performed using reverse bonding in which a conductive wire is connected from the land electrode side of the substrate 101.

As a fifth process, the die film 120 preferably defining an adhesive material is provided on the surface of the switch IC element SW+, located on a side opposite to the pad electrode side thereof, and the die film 120 is mounted on a surface on the pad electrode side of the switch IC element SW− (S105). At this time, the switch IC element SW+ is mounted so that the orientations of the switch IC elements SW− and SW+ in planar view are the same or substantially the same as each other. In addition, in this case, it is only necessary to use the alignment mark as a reference in the same manner, the alignment mark having been used when the above-mentioned switch IC element SW− has been mounted.

As a sixth process, the die film 120 is subjected to baking, and thus, the switch IC element SW+ is fixed to the switch IC element SW− (S106). At this time, the baking is preferably performed at a temperature higher than the baking of the die-bonding agent 130 performed in the third process. Due to this, in addition to connection between the switch IC elements SW− and SW+, connection between the switch IC element SW− and the substrate 101 is also accelerated.

As a seventh process, the pad electrodes of the switch IC element SW+ and the land electrodes of the substrate 101 are wire-bonded via wiring lines as illustrated in FIG. 1A (S107). At this time, the wire bonding may preferably be performed using reverse bonding in which a conductive wire is connected from the land electrode side of the substrate 101, and may also be performed using usual wire bonding in which a conductive wire is connected from the pad electrode side of the switch IC element SW+.

In addition, the die film is used as an adhesive material between the switch IC element SW− and the switch IC element SW+ in the fifth process in the present preferred embodiment. However, for example, after a die-bonding material has been applied as an adhesive material to a surface on the pad electrode side of the switch IC element SW− or a surface on a side opposite to the pad electrode side of the switch IC element SW+, the switch IC element SW+ may also be mounted on the switch IC element SW−. At this time, in the sixth process, the die-bonding material is cured, and the switch IC element SW+ is fixed to the switch IC element SW−.

In addition, when the die-bonding material is applied, it is preferable that a die-bonding material having an insulation property is applied to the entire or substantially the entire surface. However, in a state in which an insulation property between different pad electrodes or different wires is maintained, a conductive die-bonding material may also be used.

Figure 5A:
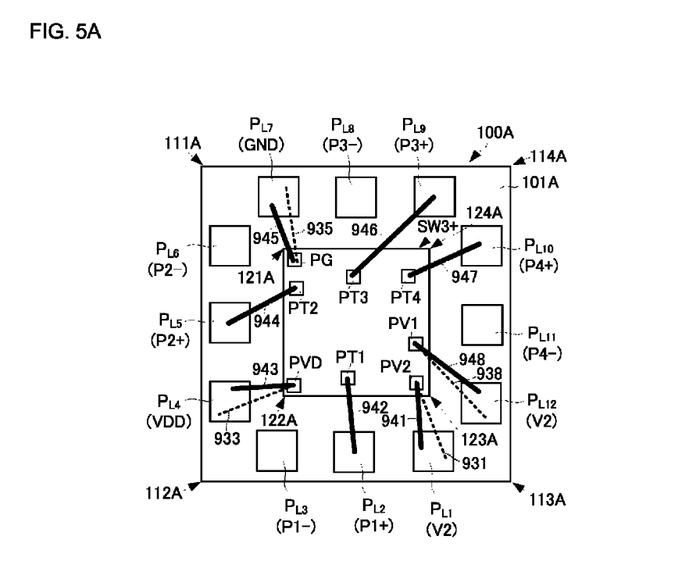
FIGS. 5A and 5B are diagrams illustrating a mounting configuration of a high-frequency module according to a second preferred embodiment of the present invention.
Figure 5B:
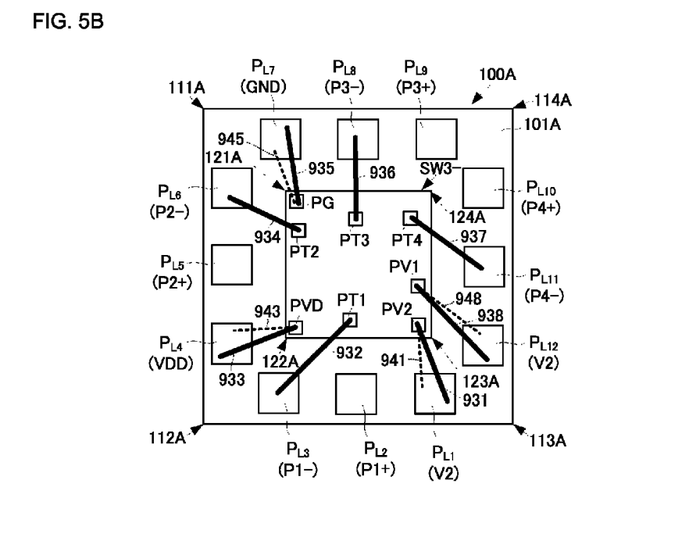
Figure 6:
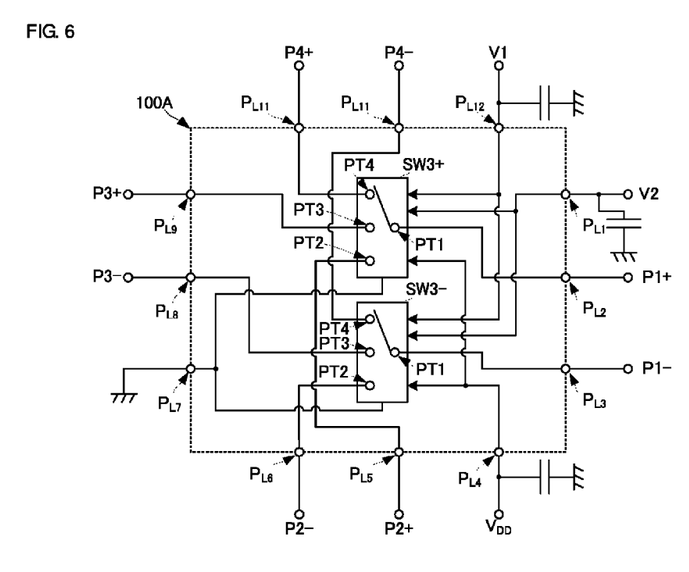
FIG. 6 is an equivalent circuit diagram of the high-frequency module 100A according to the second preferred embodiment of the present invention.

Next, a high-frequency module according to a second preferred embodiment of the present invention will be described with reference to the drawings. FIGS. 5A and 5B are diagrams illustrating the mounting configuration of a high-frequency module 100A according to the second preferred embodiment of the present invention. FIG. 5A illustrates a connection relationship between a substrate 101A and a switch IC element SW3+, and FIG. 5B illustrates a connection relationship between the substrate 101A and a switch IC element SW3−. FIG. 6 is the equivalent circuit diagram of the high-frequency module 100A according to the second preferred embodiment of the present invention. While, in the above-described high-frequency module 100 according to the first preferred embodiment, one balanced line is preferably connected to two balanced lines in a switching manner, one balanced line is preferably connected to three balanced lines in a switching manner in the high-frequency module 100A of the second preferred embodiment. Accordingly, a manufacturing process preferably is the same or substantially the same, and the description thereof will be omitted.

The high-frequency module 100A according to the second preferred embodiment of the present invention includes the two switch IC elements SW3− and SW3+ and the substrate 101A.

The switch IC element SW3− and the switch IC element SW3+ are preferably bare chips of semiconductors, for example, and have the same or substantially the same shapes and circuit configurations. Furthermore, the switch IC element SW3− and the switch IC element SW3+ preferably have the same or substantially the same configuration of pad electrodes used for external connections and the same or substantially the same patterns. The switch IC element SW3− corresponds to the "first switch IC" of a preferred embodiment of the and the switch IC element SW3+ corresponds to the "second switch IC".

Each of the switch IC elements SW3− and SW3+ is preferably a SP3T (Single Pole 3 Throw) switch, driven by a driving voltage signal VDD from the outside, and connects, in a switching manner, a pad electrode PT1 (a first port) to one of a pad electrode PT2 (a second port), a pad electrode PT3 (a third port), and a pad electrode PT4 (a fourth port) in response to the combination of control signals V1 and V2.

In the first main surface of the substrate 101A, a plurality of land electrodes $P_{L1}$ to $P_{L12}$ are arranged in a predetermined array pattern. In other words, the first main surface of the substrate 101A is the component mounting surface of the corresponding substrate. As schematically illustrated in FIGS. 5A and 5B, the plural land electrodes $P_{L1}$ to $P_{L12}$ are arranged so as to surround the mounting positions of the switch IC elements SW3− and SW3+.

More specifically, the plural land electrodes $P_{L1}$ to $P_{L12}$ are arranged in the following pattern. Here, for ease of explanation, it is assumed that the substrate 101A has a rectangular or substantially rectangular planar shape (actually, corresponds to a rectangular-shaped or substantially rectangular-shaped region in the substrate 101A).

Substantially along a direction connecting the first corner portion 111A (an upper left corner portion in the front view of FIG. 5) of this rectangular or substantially rectangular shape with the second corner portion 112A thereof (a lower left corner portion in the front view of FIG. 5), the land electrode $P_{L6}$, the land electrode $P_{L5}$, and the land electrode $P_{L4}$ are arranged at intervals with predetermined areas, in order starting from a first corner portion 111A side.

Substantially along a direction connecting the second corner portion 112A with a third corner portion 113A (a lower right corner portion in the front view of FIG. 5), the land electrode $P_{L3}$, the land electrode $P_{L2}$, and the land electrode $P_{L1}$ are arranged at intervals with predetermined areas, in order starting from a second corner portion 112A side.

Substantially along a direction connecting the third corner portion 113A with a fourth corner portion 114A (a upper right corner portion in the front view of FIG. 5), the land electrode $P_{L12}$, the land electrode $P_{L11}$, and the land electrode $P_{L10}$ are arranged at intervals with predetermined areas, in order starting from a third corner portion 113A side.

Substantially along a direction connecting the fourth corner portion 114A with the first corner portion 111A, the land electrode $P_{L9}$, the land electrode $P_{L8}$, and the land electrode $P_{L7}$ are arranged at intervals with predetermined areas, in order starting from a fourth corner portion 114A side.

In addition, in the first main surface of the substrate 101A, the switch IC element SW3− is mounted substantially in the center of a region surrounded by the plural land electrodes $P_{L1}$ to $P_{L12}$. The switch IC element SW3− is mounted so that the pad electrodes thereof face a side opposite to the substrate 101A. The switch IC element SW3− is mounted on the substrate 101A via a die-bonding agent.

The switch IC element SW3+ is mounted on the pad electrode side of the switch IC element SW3−. The switch IC element SW3+ is mounted so that pad electrodes face a side opposite to the switch IC element SW3− and the substrate 101A. The switch IC element SW3+ is mounted above the switch IC element SW3− through a die film.

The switch IC elements SW3− and SW3+ include pad electrodes PT1, PT2, PT3, PT4, PG, PVD, PV1, and PV2. The pad electrodes PG are disposed in the vicinities of the corner portions 121A of the switch IC elements SW3− and SW3+. The pad electrodes PVD are disposed in the vicinities of the corner portions 122A of the switch IC elements SW3− and SW3+. The pad electrodes PT2 are disposed between the pad electrodes PG and the pad electrodes PVD. In other words, the pad electrodes PT2 are disposed at predetermined positions located midway in sides connecting the corner portions 121A and 122A with each other in the switch IC elements SW3− and SW3+. The pad electrodes PV2 are disposed in the vicinities of the corner portions 123A of the switch IC elements SW3− and SW3+. The corner portions 123A are the opposing corners of the corner portions 121A. The pad electrodes PT4 are disposed in the vicinities of the corner portions 124A of the switch IC elements SW3− and SW3+. The corner portions 124A are the opposing corners of the corner portions 122A. The pad electrodes PV1 are disposed between the pad electrodes PV2 and the pad electrodes PT4. In other words, the pad electrodes PV1 are disposed at predetermined positions located in the middle of sides connecting the corner portions 123A and 124A with each other in the switch IC elements SW3− and SW3+. The pad electrodes PT3 are disposed between the pad electrodes PT4 and the pad electrodes PT2. In other words, the pad electrodes PT3 are disposed at predetermined positions located in the middle of sides connecting the corner portions 124A and 121A with each other in the switch IC elements SW3− and SW3+.

The switch IC element SW3− and the switch IC element SW3+, which have such configurations of pad electrodes, are aligned in the same or substantially the same orientation and mounted when viewed from a direction perpendicular or substantially perpendicular to the component mounting surface of the substrate 101A. Furthermore, at this time, the switch IC element SW3− and the switch IC element SW3+ are mounted so that the corner portions 121A of the switch IC elements SW3− and SW3+ are located on the corner portion 111A side of the substrate 101A and the corner portions 123A thereof are located on the corner portion 113A side of the substrate 101A.

The pad electrode PT1 of the switch element SW3− is connected to the land electrode $P_{L3}$ of the substrate 101A by a conductive wire 932. The pad electrode PT2 of the switch element SW3− is connected to the land electrode $P_{L6}$ of the substrate 101A by a conductive wire 934. The pad electrode PT3 of the switch element SW3− is connected to the land electrode $P_{L8}$ of the substrate 101A by a conductive wire 936. The pad electrode PT4 of the switch element SW3− is connected to the land electrode $P_{L11}$ of the substrate 101A by a conductive wire 937.

The pad electrode PG of the switch element SW3− is connected to the land electrode $P_{L7}$ of the substrate 101A by a conductive wire 935. The pad electrode PVD of the switch element SW3− is connected to the land electrode $P_{L4}$ of the substrate 101A by a conductive wire 933. The pad electrode PV1 of the switch element SW3− is connected to the land electrode $P_{L12}$ of the substrate 101A by a conductive wire 938. The pad electrode PV2 of the switch element SW3− is connected to the land electrode $P_{L1}$ of the substrate 101A by a conductive wire 931.

The pad electrode PT1 of the switch element SW3+ is connected to the land electrode $P_{L2}$ of the substrate 101A by a conductive wire 942. The pad electrode PT2 of the switch element SW3+ is connected to the land electrode $P_{L5}$ of the substrate 101A by a conductive wire 944. The pad electrode PT3 of the switch element SW3+ is connected to the land electrode $P_{L9}$ of the substrate 101A by a conductive wire 946.

The pad electrode PT4 of the switch element SW3+ is connected to the land electrode $P_{L10}$ of the substrate 101A by a conductive wire 947.

The pad electrode PG of the switch element SW3+ is connected to the land electrode $P_{L7}$ of the substrate 101A by a conductive wire 945. The pad electrode PVD of the switch element SW3+ is connected to the land electrode $P_{L4}$ of the substrate 101A by a conductive wire 943. The pad electrode PV1 of the switch element SW3+ is connected to the land electrode $P_{L12}$ of the substrate 101A by a conductive wire 948. The pad electrode PV2 of the switch element SW3+ is connected to the land electrode $P_{L1}$ of the substrate 101A by a conductive wire 941.

Due to such a configuration as described above, the high-frequency module 100A having the equivalent circuit illustrated in FIG. 6 is achieved. In the high-frequency module 100A, first balanced terminals, whose first individual terminal is the pad electrode PT1 of the switch IC element SW3− and whose second individual terminal is the pad electrode PT1 of the switch IC element SW3+, are selectively connected to second balanced terminals whose individual terminal pair are the pad electrodes PT2 of the switch IC elements SW3− and SW3+, third balanced terminals whose individual terminal pair are the pad electrodes PT3 of the switch IC elements SW3− and SW3+, or fourth balanced terminals whose individual terminal pair are the pad electrodes PT4 of the switch IC elements SW3− and SW3+.

A balanced signal, input from an external connection terminal P1+ connected to the land electrode $P_{L1}$ and an external connection terminal P1− connected to the land electrode $P_{L3}$, is input to the first balanced terminals defined by the pad electrodes PT1 of the switch IC elements SW3+ and SW3−. The switch IC elements SW3+ and SW3− are supplied with power due to the driving voltage signal VDD applied through the land electrode $P_{L4}$ and the pad electrodes PVD. The switch IC elements SW3+ and SW3− perform switching control in response to the combination of the switching control signal V1 applied through the land electrode $P_{L12}$ and the pad electrodes PV1 and the switching control signal V2 applied through the land electrode $P_{L1}$ and the pad electrodes PV2.

The switch IC elements SW3+ and SW3− switch the connection states thereof, and thus, the balanced signal input to the first balanced terminals is output to the second balanced terminals, the third balanced terminals, or the fourth balanced terminals. The balanced signal output from the second balanced terminals is output from external connection terminals P2+ and P2− to an external circuit through the land electrodes $P_{L5}$ and $P_{L6}$. The balanced signal output from the third balanced terminals is output from external connection terminals P3+ and P3− to an external circuit through the land electrodes $P_{L9}$ and $P_{L8}$. The balanced signal output from the fourth balanced terminals is output from external connection terminals P4+ and P4− to an external circuit through the land electrodes $P_{L10}$ and $P_{L11}$.

In addition, in the high-frequency module 100A having the above-described configuration, the following functional effects are obtained.

The switch IC elements SW− and SW+ are mounted on the component mounting surface of the substrate 101A so as to overlap each other, and thus, it is possible to reduce a mounting area when the switch circuit of a balanced signal includes two switch IC elements. In particular, as in the present preferred embodiment, the miniaturization of a high-frequency module is more effectively achieved with an increase in the number of selection lines.

When, in the same or substantially the same manner as the first preferred embodiment, the switch IC elements SW3− and SW3+ are mounted on the substrate 101A using the configuration described above, a pad electrode and a land electrode, connected to each other by a conductive wire, are located near each other when viewed from a direction perpendicular to the component mounting surface of the substrate 101A, and between these electrodes, another pad electrode or another land electrode is not provided.

For example, the pad electrode PT2 of the switch IC element SW3+ and the land electrode $P_{L5}$ are located near each other, and between these electrodes, another pad electrode or another land electrode is not provided. In the same or substantially the same manner, the pad electrode PT2 of the switch IC element SW3− and the land electrode $P_{L6}$ are located near each other, and between these electrodes, another pad electrode or another land electrode is not provided.

By using such a configuration, conductive wires transmitting a balanced signal input or output to or from the first balanced terminals, conductive wires transmitting a balanced signal input or output to or from the second balanced terminals, conductive wires transmitting a balanced signal input or output to or from the third balanced terminals, and conductive wires transmitting a balanced signal input or output to or from the fourth balanced terminals may be arranged without intersecting with each other. Due to this, it is possible to significantly reduce or prevent mutual interference between the transmission path of the balanced signal input or output to or from the first balanced terminals, the transmission path of the balanced signal input or output to or from the second balanced terminals, the transmission path of the balanced signal input or output to or from the third balanced terminals, and the transmission path of the balanced signal input or output to or from the fourth balanced terminals, and it is possible to ensure high isolation between the individual transmission paths. In addition, since it is not necessary to provide an electrode pattern used for intersection in the substrate 101A, the electrode pattern of the substrate 101A is simplified, design is facilitated, and formation is also facilitated.

In addition, as illustrated in FIGS. 5A and 5B, land electrodes are arranged so that distances between the individual pad electrodes of the switch IC elements SW3− and SW3+, which define the balanced terminals, and land electrodes to which these are connected are equal or approximately equal to each other. Specifically, for example, a distance between the pad electrode PT2 of the switch IC element SW3+ and the land electrode $P_{L5}$, projected on to the component mounting surface of the substrate 101A, and a distance between the pad electrode PT2 of the switch IC element SW3− and the land electrode $P_{L6}$, projected on to the component mounting surface of the substrate 101A, are equal or approximately equal to each other. Due to this, the transmission distance of a signal between the land electrode $P_{L5}$ and the pad electrode PT2 of the switch IC element SW3+ and the transmission distance of a signal between the land electrode $P_{L6}$ and the pad electrode PT2 of the switch IC element SW3− are equal or approximately equal to each other. Accordingly, by only slightly adjusting the wire lengths of the conductive wires 934 and 944, it is possible to improve the balance characteristic of a signal transmitted through the balanced lines.

In addition, while not being described in detail, the same or substantially the same relationships between pad electrodes and land electrodes are also maintained with respect to the second balanced terminals, the third balanced terminals, and the fourth balanced terminals, in the same or substantially the same manner as the first preferred embodiment, and it is also possible to improve the balance characteristics of signals transmitted through balanced lines connected to these balanced terminals.

In addition, the balance characteristics of all of the balanced lines are superior, and thus, a high balance characteristic is achieved in the high-frequency module 100A.

In addition, the above-described pad electrodes PG, PVD, PV1, and PV2 in both of the switch IC elements SW3− and SW3+ are preferably connected to the same land electrodes. However, as illustrated in FIGS. 5A and 5B, a position at which a conductive wire from the switch IC element SW3− is connected to a land electrode is spaced away from the mounting positions of the switch IC elements SW3− and SW3+, as compared to a position at which a conductive wire from the switch IC element SW3+ is connected to a land electrode.

Specifically, for example, a position at which the conductive wire 933 that establishes a connection from the pad electrode PVD of the switch IC element SW3− to the land electrode $P_{L4}$ of the substrate 101A is connected to the land electrode $P_{L4}$ is farther than a position at which the conductive wire 943 that establishes a connection from the pad electrode PVD of the switch IC element SW3+ to the land electrode $P_{L4}$ of the substrate 101A is connected to the land electrode $P_{L4}$.

In the same or substantially the same manner, a position at which the conductive wire 938 that establishes a connection from the pad electrode PV1 of the switch IC element SW3− to the land electrode $P_{L12}$ of the substrate 101A is connected to the land electrode $P_{L12}$ is farther than a position at which the conductive wire 948 that establishes a connection from the pad electrode PV1 of the switch IC element SW3+ to the land electrode $P_{L12}$ of the substrate 101A is connected to the land electrode $P_{L12}$.

In the same or substantially the same manner, a position at which the conductive wire 931 that establishes a connection from the pad electrode PV2 of the switch IC element SW3− to the land electrode $P_{L1}$ of the substrate 101A is connected to the land electrode $P_{L1}$ is farther than a position at which the conductive wire 941 that establishes a connection from the pad electrode PV2 of the switch IC element SW3+ to the land electrode $P_{L1}$ of the substrate 101A is connected to the land electrode $P_{L1}$.

Furthermore, a position at which the conductive wire 935 that establishes a connection from the pad electrode PG of the switch IC element SW3− to the land electrode $P_{L7}$ of the substrate 101A is connected to the land electrode $P_{L7}$ is farther than a position at which the conductive wire 945 that establishes a connection from the pad electrode PG of the switch IC element SW3+ to the land electrode $P_{L7}$ of the substrate 101A is connected to the land electrode $P_{L7}$.

Due to this, it is possible to set the wire lengths of a conductive wire from the switch IC element SW3+ and a conductive wire from the switch IC element SW3− so as to be equal or approximately equal to each other, the loop height of the conductive wire from the switch IC element SW3+ becoming high, the loop height of the conductive wire from the switch IC element SW3− being controlled so as to be low. Due to this, the lengths of conductors connecting a common land electrode and the switch IC elements SW3− and SW3+ to each other are equal or approximately equal to each other.

Accordingly, in the same or substantially the same manner as the first preferred embodiment, it is possible to simultaneously supply the driving voltage signal VDD or the switching control signals V1 and V2 to the switch IC elements SW3− and SW3+. In addition, it is possible to set the ground lines of the switch IC elements SW3− and SW3+ so as to be equal or substantially equal to each other. Due to this, switching accuracy as the switch circuit of a balanced signal is improved, and it is also possible to improve ground balance between the switch IC elements.

In addition, while, in the above-described preferred embodiments of the present invention, the configuration in which the two balanced lines are switched and the configuration in which the three balanced lines are switched have been illustrated and described, preferred embodiments of the present invention may be used for a configuration in which four or more balanced lines are switched.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A high-frequency module comprising:
a first switch IC and a second switch IC defining a switch circuit for a balanced signal and including pad electrodes, in which arrangements of the pad electrodes in each of the first switch IC and the second switch IC are the same or substantially the same as each other; and
a substrate including land electrodes connected to the pad electrodes and including electrodes connecting the first switch IC and the second switch IC to an external circuit; wherein
the first switch IC is mounted on the substrate;
the second switch IC is mounted on a surface of the first switch IC on a second side of the first switch IC opposite to a first side mounted on the substrate;
the first switch IC and the second switch IC are mounted so that the pad electrodes are provided on a surface on the second side;
the pad electrodes and the land electrodes are connected to each other via wire bonding; and
between the pad electrodes connected via the wire bonding and the land electrodes, another land electrode or another pad electrode is not provided.
2. The high-frequency module according to claim 1, wherein the first switch IC and the second switch IC are the same switch ICs.
3. The high-frequency module according to claim 1, wherein the second switch IC is mounted on a surface of the first switch IC on the second side via an adhesive.
4. The high-frequency module according to claim 1, wherein the first switch IC and the second switch IC are mounted in the same or substantially the same orientation.
5. The high-frequency module according to claim 4, wherein
the first switch IC includes a first individual terminal defining a balanced terminal;
the second switch IC includes a second individual terminal defining another balanced terminal; and
a distance between a first pad electrode defining the first individual terminal and a first land electrode connected to the first pad electrode via the wire bonding, and a distance between a second pad electrode defining the second individual terminal and a second land electrode connected to the second pad electrode via the wire bonding are equal or approximately equal to each other.
6. The high-frequency module according to claim 4, wherein
a third pad electrode in the first switch IC and a fourth pad electrode in the second switch IC are arranged so as to overlap or substantially overlap each other;

the third pad electrode in the first switch IC and the fourth pad electrode in the second switch IC are connected to a common third land electrode;

a position at which a wire providing a connection between the third pad electrode and the third land electrode is connected to the third land electrode is spaced away from positions at which the first and second switch ICs are mounted on the substrate, as compared to a position at which a wire providing a connection between the fourth pad electrode and the third land electrode is connected to the third land electrode.

* * * * *